United States Patent
Akiyama

(10) Patent No.: US 6,639,240 B2
(45) Date of Patent: Oct. 28, 2003

(54) PHOTOSEMICONDUCTOR DEVICE AND METHOD FOR FABRICATING THE SAME

(75) Inventor: Tomoyuki Akiyama, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/102,797

(22) Filed: Mar. 22, 2002

(65) Prior Publication Data

US 2003/0066997 A1 Apr. 10, 2003

(30) Foreign Application Priority Data

Oct. 9, 2001 (JP) ......................... 2001-311046

(51) Int. Cl.⁷ .................. H01L 33/00; H01L 29/76
(52) U.S. Cl. .................. 257/9; 257/21; 257/24
(58) Field of Search ................ 257/9, 21, 24

(56) References Cited

U.S. PATENT DOCUMENTS

| | | | |
|---|---|---|---|
| 5,936,258 A | 8/1999 | Imamura et al. ......... 257/21 |
| 5,977,557 A * | 11/1999 | Kim | |
| 6,333,214 B1 * | 12/2001 | Kim et al. | |
| 6,369,405 B1 * | 4/2002 | Canham et al. | |
| 6,440,340 B1 * | 8/2002 | Smith et al. | |
| 6,445,009 B1 * | 9/2002 | Grandjean et al. | |

FOREIGN PATENT DOCUMENTS

| JP | 06-196819 A | 7/1994 |
|---|---|---|
| JP | 09-082900 A | 3/1997 |

OTHER PUBLICATIONS

P. Borri et al.; "Time–Resolved Four–Wave Mixing in InAs/InGaAs Quantum–Dot Amplifiers Under Electrical Injection", Applied Physics Letters, vol. 76, No. 11; Mar. 13, 2000, pp. 1380–1382.

* cited by examiner

Primary Examiner—Stephen D. Meier
(74) Attorney, Agent, or Firm—Armstrong, Westerman & Hattori, LLP

(57) ABSTRACT

A photosemiconductor device comprises a plurality fo quantum dots 22, and the plural quantum dots 22 have disuniform sizes. Quantum dots of disuniform sizes are formed by a low area ratio, whereby the photosemiconductor device can have a wide gain band.

16 Claims, 9 Drawing Sheets

——————— : QUANTUM DOTS (F=0.1)
- - - - - - - : QUANTUM WELL ACTIVE LAYER (1 LAYER)
——————— : QUANTUM DOTS (F=0.1)
- - - - - - - : QUANTUM WELL ACTIVE LAYER (1 LAYER)

PHOTOSEMICONDUCTOR DEVICE AND METHOD FOR FABRICATING THE SAME

BACKGROUND OF THE INVENTION

The present invention relates to a photosemiconductor device and a method for fabricating the photosemiconductor device, more specifically to a photosemiconductor device having quantum dots and a method for fabricating the photosemiconductor device.

Semiconductor light amplifiers and semiconductor lasers are small-sized and have small electric power consumptions, which makes them attractive in the fields of optical communication, etc.

A conventional semiconductor light amplifier will be explained with reference to FIG. 9. FIG. 9 is a sectional view of the conventional semiconductor light amplifier.

As shown in FIG. 9, a clad layer 112 of n type InP is formed on a semiconductor substrate 110 of n type InP. A bulk active layer 124 of InGaAs is formed on the clad layer 112. A clad layer 136 is formed on the bulk active layer 124. The clad layer 136, the bulk active layer 124 and the clad layer 112 are formed in a mesa as a whole and form a mesa-shaped light waveguide layer 138. A current constriction layer 118 is formed of a p type InP layer 118a and an n type InP layer 118b on both sides of the light waveguide layer 138. A cap layer 140 is formed of n type InP on the light waveguide layer 138 and the current constriction layer 118. AR (Anti-Reflection) coat film (not shown) is formed on both sides of the mesa-shaped light waveguide layer 138. The conventional semiconductor light amplifier has such structure.

The use of a quantum well active layer in place of the bulk active layer 124 is also proposed. The use of the quantum well active layer can improve gains in comparison with the use of the bulk active layer.

However, the gain bandwidth of the conventional semiconductor light amplifier using the bulk active layer and the quantum well active layer is small. Accordingly, the conventional semiconductor light amplifier cannot amplify a WDM (Wavelength Division Multiplexing) signal of a wide band at once.

Here, injecting more current into the bulk active layer and the quantum well active layer increases numbers of electrons and holes stored in the bulk active layer and the quantum active layer, which will widen the gain bandwidth. However, the increase of the injected current to the bulk active layer and the quantum well active layer increases calorific powers, and temperatures of the bulk active layer and the quantum well active layer rise. Thus, there is a limit to widening the gain bandwidth by injecting more current into the bulk active layer and the quantum well active layer.

Decreasing a thickness of the bulk active layer or decreasing a layer number of the quantum well active layer decreases a state density of carriers per a unit area of the current injection region, whereby a Fermi level could be transferred to a higher energy side, and the gain bandwidth could be widened. However, even decreasing, e.g., a layer number of the quantum well active layer to one layer will widen the gain bandwidth to about 70 nm at maximum.

Here, a high reflection film (not shown) is formed on both side surfaces of the mesa-shaped light waveguide layer 138 to thereby form a semiconductor laser. However, the conventional semiconductor lasers using the balk active layer and the quantum well active have narrow gain bandwidths and accordingly narrow wavelength variable ranges.

SUMMARY OF THE INVENTION

An object of the present invention is to provide a photosemiconductor device of a wide gain bandwidth, and a method for fabricating the photosmeiconductor device.

According to one aspect of the present invention, there is provided a photosemiconductor device comprising a plurality of quantum dots, the plurality of quantum dots having disuniform sizes.

According to another aspect of the present invention, there is provided a method for fabricating a photosemiconductor device comprising the step of: forming a plurality of quantum dots of disuniform sizes on a semiconductor substrate.

As described above, according to the present invention, the quantum dots of disuniform sizes are formed by a low area ratio, whereby the photosemiconductor device can have a wide gain bandwidth.

DETAILED DESCRIPTION OF THE INVENTION (Principle of the Present Invention)

First, the principle of the present invention will be explained with reference to FIGS. 1 to 3.

Figure 1:
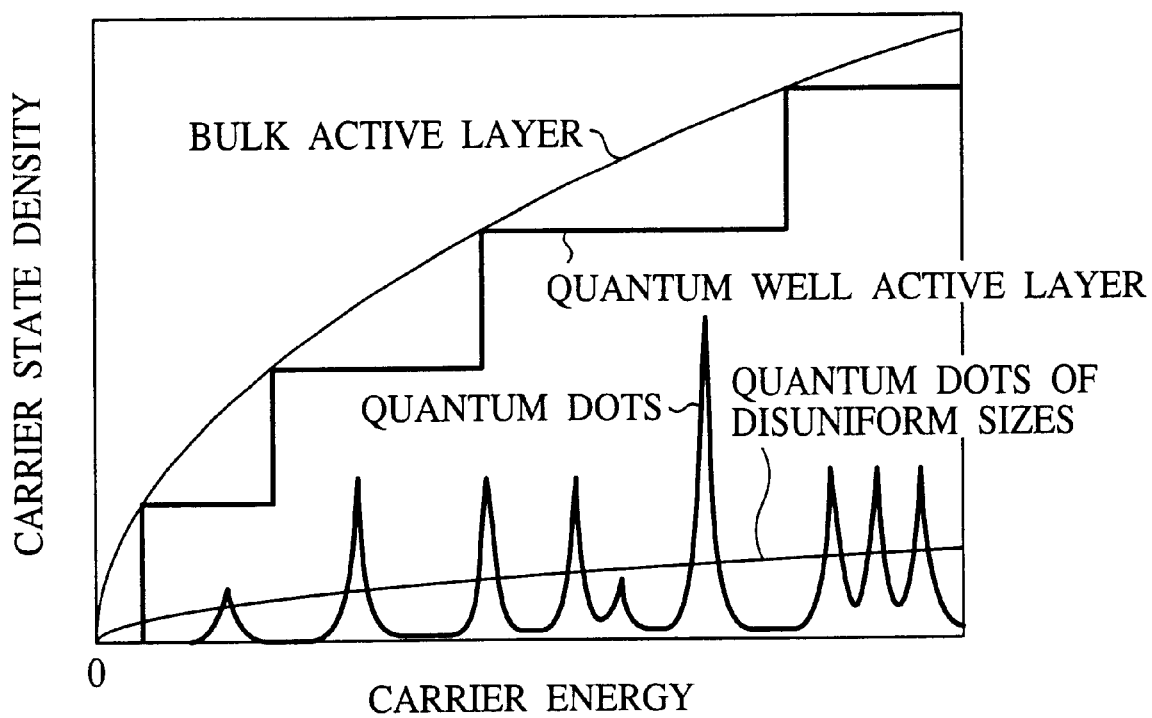
FIG. 1 is a graph of state densities of carriers in the active layer.

FIG. 1 is a graph of state densities of carriers in the active layer. Energies of the carrier are taken on the horizontal axis, and state densities of the carriers in the active layer are taken on the vertical axis.

As shown in FIG. 1, state densities of the carriers in the bulk active layer have a blunt distribution in which carrier state densities are proportional to square roots of the carrier energy. State densities of the carriers in the quantum well active layer have a stepped distribution.

For a wide gain bandwidth of the photosemiconductor device, a state density of the carriers in the active layer will be made low. In order to make a state density of the carriers in the bulk active layer, a thickness of the bulk active layer will be made thin. In order to make a state density of the carriers in the quantum well active layer, a number of layers of the quantum well active layer will be made small. However, as described above, even a decrease of a layer umber of the quantum well active layer to one layer will widen a gain bandwidth to about 70 nm at maximum. A sufficiently wide gain width cannot be obtained.

Here, quantum dots will be used as the active layer. The use of quantum dots as the active layer makes it possible to decrease a state density of the carriers in a current injection region per a unit area, which will make it possible to widen a gain bandwidth without increasing the injected current into the active layer.

However, in a case that quantum dots are merely used as the active layer, the state density distribution have some gain peaks as shown in FIG. 1. Based on this, the mere use of quantum dots will not provide a photosemiconductor device having good gain characteristics.

The inventors of the present application made earnest studies and have had an idea that quantum dots are formed in disuniform sizes to thereby obtain a blunt state density distribution as that of the carriers in the bulk active layer. Quantum dots formed in disuniform sizes interconnect the gain peaks of respective energy levels appearing in the state density distribution of the case that quantum dots are formed in a uniform size.

In the specification of the present application, a current injection region does not mean an entire region with an electrode (not shown) for injecting current formed in, but means a region where current restricted by the current constriction layer is actually injected into the active layer.

Figure 2:
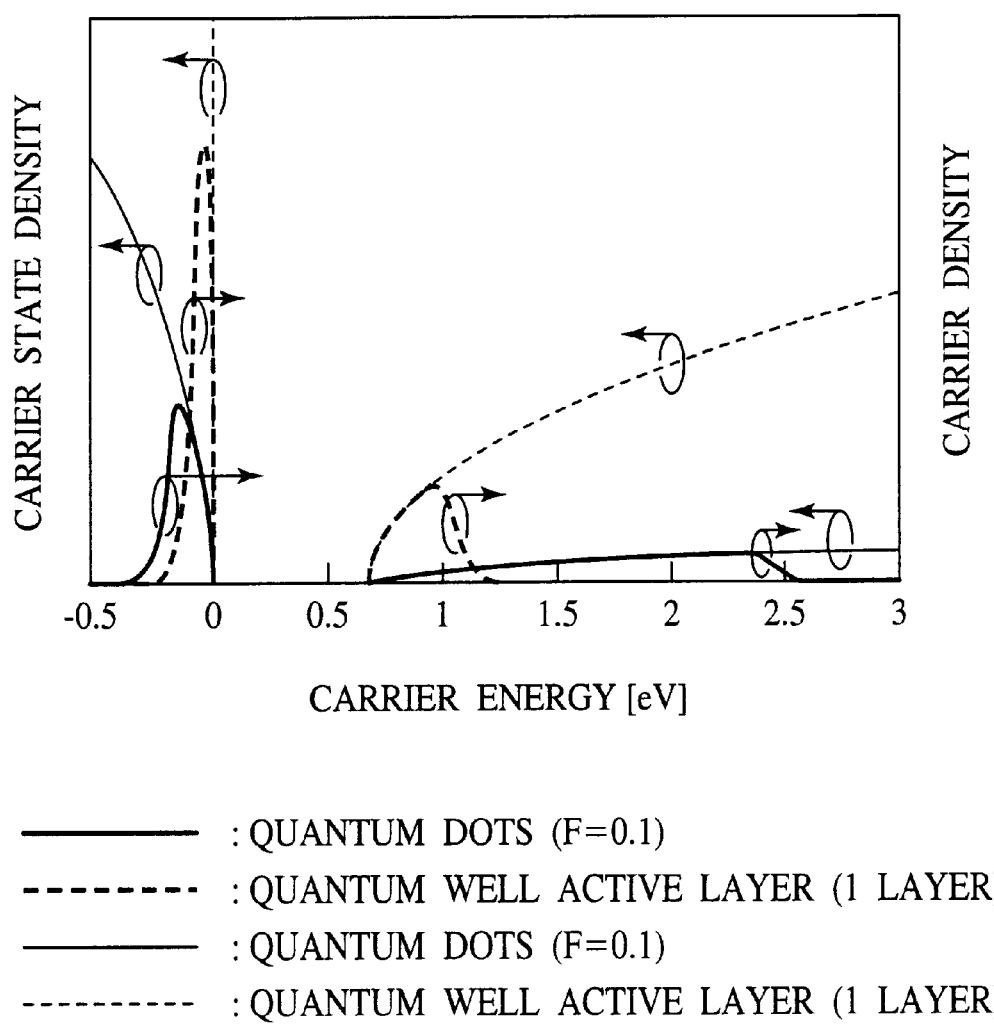
FIG. 2 is a graph of state densities of carriers and carrier densities.

FIG. 2 is a graph of state densities of carriers and carrier densities. Energies of the carriers are taken on the horizontal axis, and state densities of carriers and carrier densities are taken on vertical axis.

In FIG. 2, the thin broken line indicates state densities of carriers per a unit area of the current injection region in the case that a layer number of the quantum well active layer is one layer. As indicated by the thin broken line in FIG. 2, in the case of the quantum well active layer, state densities of the carriers per the unit area of the current injection region are relatively high.

The thin solid line in FIG. 2 indicates state densities of carriers per a unit area of the current injection region in the case that quantum dots of disuniform sizes are formed by an area ratio F of 0.1. As indicated by the thin solid line in FIG. 2, in the case that quantum dots of disuniform sizes are formed by an area ratio F of 0.1, state densities of the carriers per the unit area of the current injection region are about 1/10 those of the case that a layer number of the quantum well active layer is one layer.

Here, the area ratio F of the quantum dots means B/A given when an area of the current injection region is A, and a total of areas of a plurality of quantum dots formed in the current injection region is B. A layer number of the quantum dots is not essentially 1, and the quantum dots may be formed over a plurality of layers. When the quantum dots are formed over two layers, a total of areas of the quantum dots formed in one layer in the current injection region is $A_1$, and a total of areas of quantum dots formed in the second layer in the current injection region is $A_2$, an area ratio F of the quantum dots is expressed by $(A_1+A_2)/B$. In the case that the quantum dots are formed over n layers, when a total of areas of the quantum dots formed in the n-th layer in the current injection region is $A_n$, an area ratio F of the quantum dots is expressed by $(A_1+A_2+\ldots+A_n)/B$. When an area ratio F of the quantum dots is 1, a state density of the carriers per the unit area in the current injection area substantially agrees with state densities of the carriers per the unit area in the current injection region in the case that a layer number of the quantum well active layer is 1.

When current is injected into the active layer, carriers, i.e., electrons and holes are stored in the conduction band and the valence band in accordance with Fermi distribution.

In FIG. 2, the thick broken line indicates carrier densities in the current injection region in the case that a layer number of the quantum well active layer is 1. As indicated by the thin broken line in FIG. 2, in the case of the quantum well active layer, state densities of the carriers per the unit area in the current injection region is relatively high. Accordingly, as indicated by the thick broken line in FIG. 2, the energy distribution of the carriers is relatively narrow.

In FIG. 2, the thick solid line indicates carrier densities in the current injection region in the case that the quantum dots of disuniform sizes are formed by an area ratio F of 0.1. As indicated by the thin solid line in FIG. 2, in the case that the quantum dots of disuniform sizes are formed by an area ratio F of 0.1, the state densities of the carriers per the unit area in the current injection region are low. Accordingly, as indicated by the thick solid line in FIG. 2, an energy distribution of the carriers is very wide.

Figure 3:
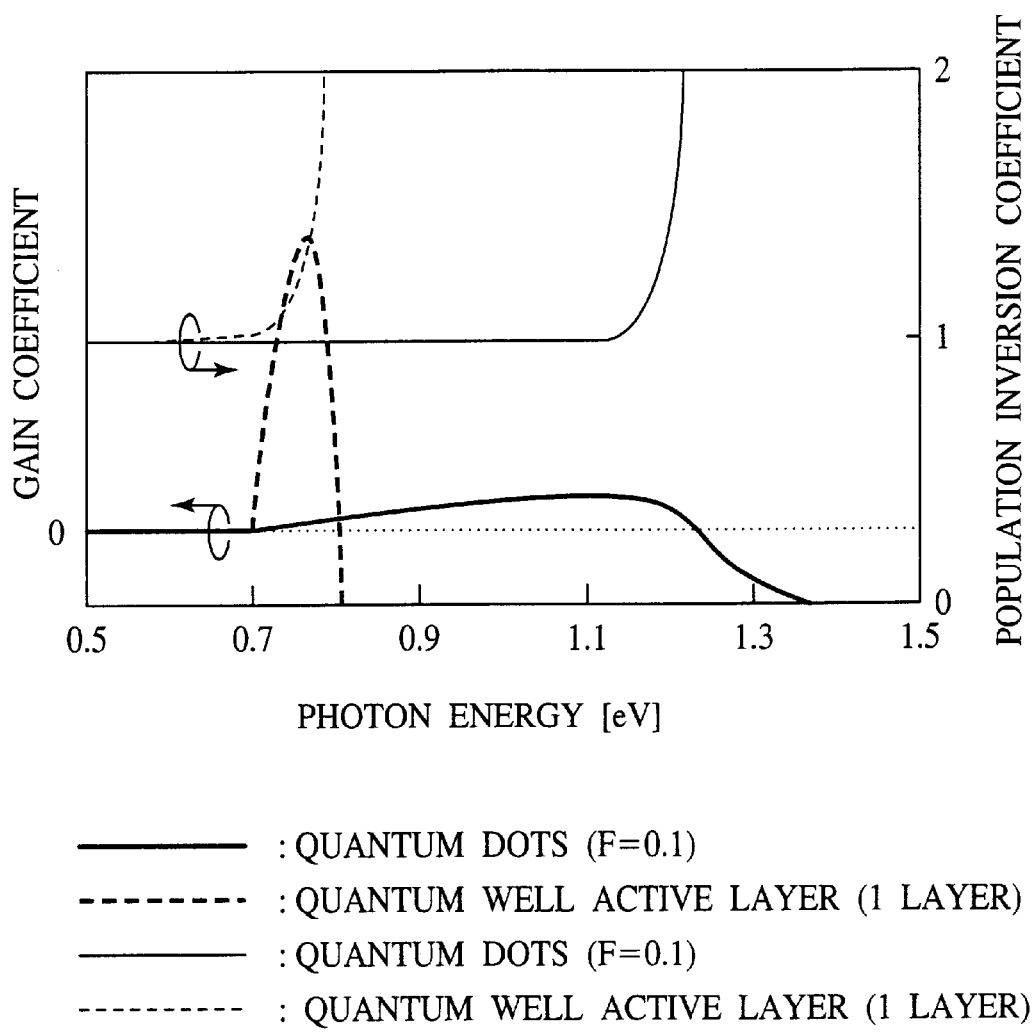
FIG. 3 is a graph of gain coefficients and population inversion coefficients.

FIG. 3 is a graph of gain coefficients and population inversion coefficients. Energies of photons are taken on the horizontal axis, and gain coefficients and population inversion coefficients are taken on the vertical axis.

The thick broken line in FIG. 3 indicates gain coefficient in the case that a layer number of the quantum well active layer is 1. A gain coefficient is g given when dP/dZ=gP wherein P is a power of light, and Z is a propagation direction. As indicated by the thick broken line in FIG. 3, in the case of the quantum well active layer, even when a layer number is 1, a width of the gain spectrum is relatively narrow.

In FIG. 3, the thick solid line indicates gain coefficients in the case that the quantum dots of disuniform sizes are formed by an area ratio F of 0.1. As indicated by the thick solid line in FIG. 3, the quantum dots of a uniform size are formed by a area ratio F of 0.1, a width of the gain spectrum is very wide.

Thus, it is found that the quantum dots of disuniform sizes are formed by a low area ratio F, whereby a photosemicodncudtor device having a wide gain band can be provided.

The thin broken line in FIG. 3 indicates population inversion coefficients in the case that a layer number of the quantum well active layer is 1. As indicated by the thin broken line in FIG. 3, in the case of the quantum well active layer, an energy range of small population inversion coefficients is relatively narrow.

A population inversion coefficient is expressed by $F_c/(F_c-F_v)$ where an abundance probability of electrons in the conduction band is $F_c$, and an abundance probability of electrons in the valence band is $F_v$. As an energy range of small population inversion coefficients is wider, the noise characteristics are better.

The thin solid line in FIG. 3 indicates population inversion coefficients in the area that the quantum dots of disuniform sizes are formed by an area ratio F of 0.1. As indicated by the thin solid line in FIG. 3, in the case that the quantum dots of disuniform sizes are formed by an area ratio F of 0.1, an energy range of small population inversion coefficients is very wide.

Thus, it is found that the quantum dots of disuniform sizes are formed by an low area ratio F, whereby a photosemiconductor device having good noise characteristics can be provided.

As described above, the inventors of the present application has had an idea that the quantum dots of disuniform sizes are formed by a low area ratio F, whereby a photosemiconductor device having a wide gain band and good noise characteristics can be provided without increasing current injection into the active layer.

Figure 4:
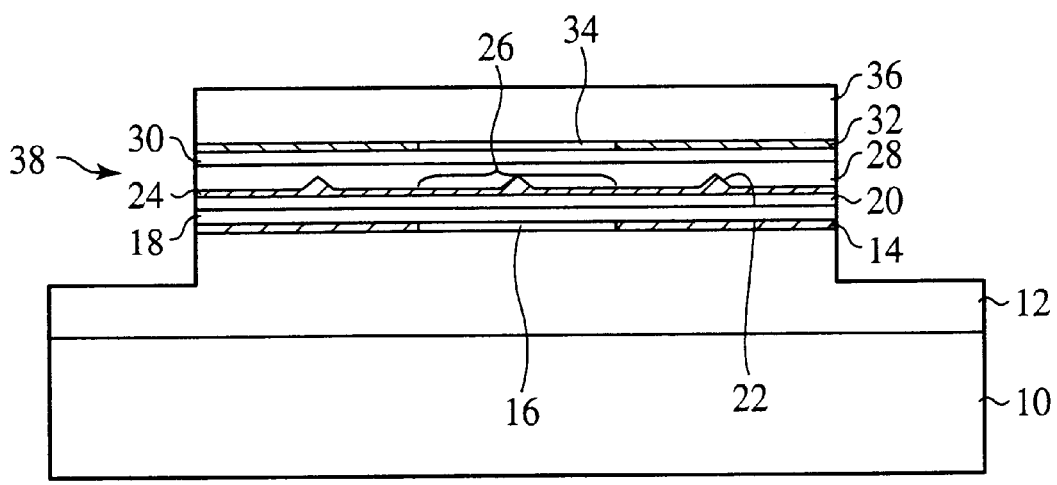
FIG. 4 is a sectional view of the photosemiconductor device according to one embodiment of the present invention.
Figure 5:
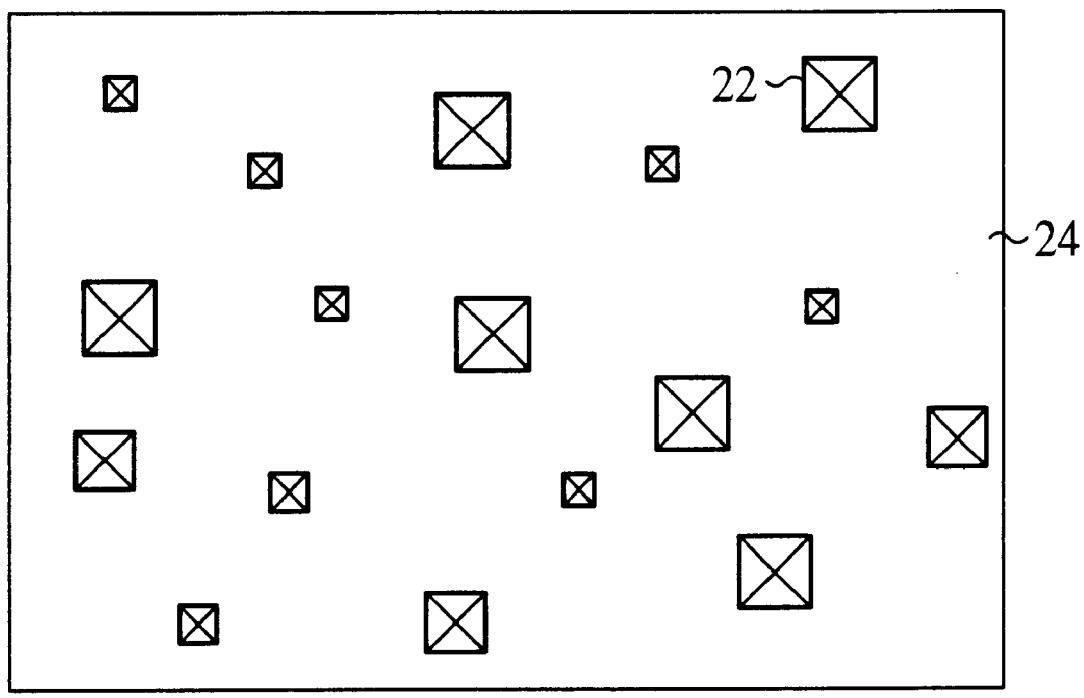
FIG. 5 is a plan view of the quantum dots of the photosemiconductor device according to the embodiment of the present invention.
Figure 6:
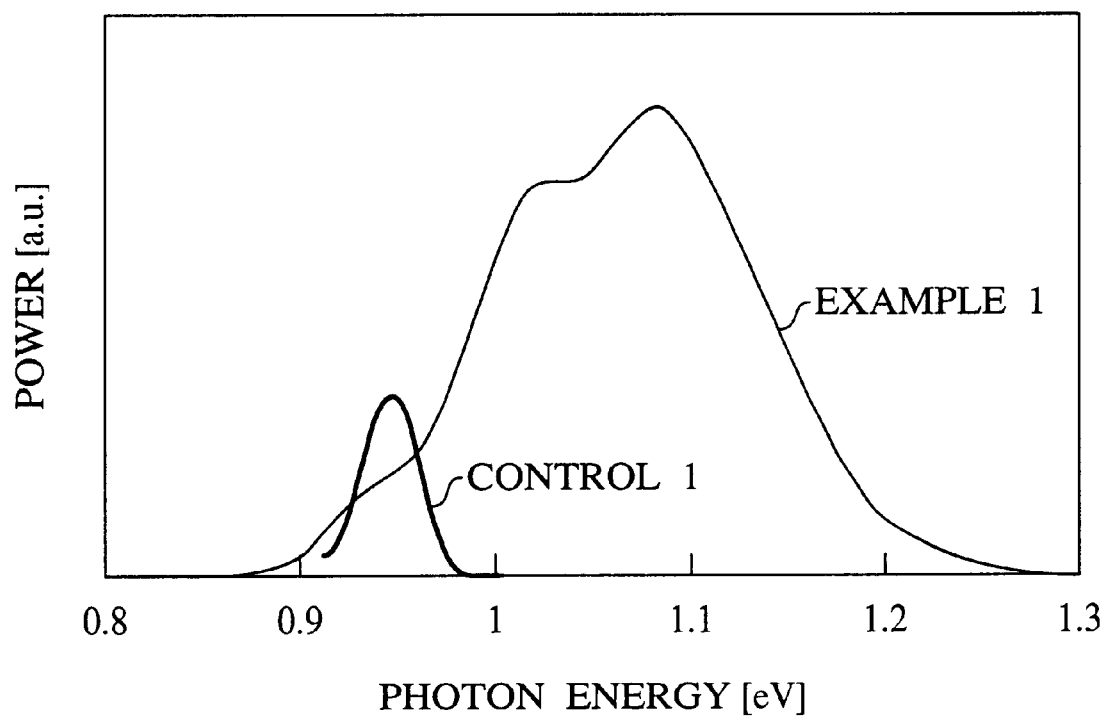
FIG. 6 is a graph of a gain spectrum of the photosemiconductor device according to the embodiment of the present invention.

Then, the photosemiconductor device according to one embodiment of the present invention and the method for fabricating the semiconductor device will be explained with reference to FIGS. 4 to 8C. FIG. 4 is a sectional view of the photosemiconductor device according to the present embodiment. FIG. 5 is a plan view of showing the quantum dots of the photosemiconductor device according to the present embodiment. FIG. 6 is a graph of a gain spectrum of the photosemiconductor device according to the present embodiment. FIGS. 7A to 8C are sectional views of the photosemiconductor device according to the present embodiment in the steps of the method for fabricating the photosemiconductor device.

In the present embodiment, the principle of the present invention is applied to a semiconductor light amplifier. However, the principle of the present invention is not limited to the application to semiconductor light amplifiers and is applicable to any other photosemiconductor devices, such as semiconductor lasers, etc.

(Photosemiconductor Device)

First, the photosemiconductor device according to the present embodiment will be explained with reference to FIGS. 4 and 5.

A clad layer 12 of n type $Al_{0.4}Ga_{0.6}As$ is formed on a semiconductor substrate 10 of n type GaAs.

A current constriction layer 14 of $Al_2O_3$ and a current pass layer 16 of AlAs are formed on the clad layer 12.

An n type $Al_{0.4}Ga_{0.6}As$ layer 18 is formed on the current constriction layer 14 and the current pass layer 16.

An SCH (Separate Confinement Heterostructure) layer 20 of GaAs is formed on the n type $Al_{0.4}Ga_{0.6}As$ layer 18.

An InAs layer 24 with a plurality of quantum dots of disuniform sizes self-formed in is formed on the SCH layer 20. The quantum dots 22 can be formed by, e.g., Stranski-Krastanow mode (hereinafter called "S-K mode"). In S-K mode, semiconductor crystals to be epitaxially grown grow two-dimensionally (in film) at the start of the growth and grow three dimensionally when the growth has exceeded an elastic limit of the film. To self-form the quantum dots 22 in three-dimensionally grown islands by S-K mode, it is required to form a film of a larger lattice constant than a material of a base film. S-K mode, which can easily facilitate the self-formation, is generally used.

As shown in FIG. 5, the quantum dots 22 have disuniform sizes. The sizes of the quantum dots 22 are made disuniform so as to obtain a blunt state density distribution as described above.

An area ratio F of the quantum dots 22 is, e.g., 0.1. This is because an area radio F of the quantum dots 22 is as low as 0.1, whereby, as described above, the photosemiconductor device can have a wide gain band.

An area ratio F of the quantum dots 22 is not essentially limited to 0.1. For example, an area ratio F of the quantum dots 22 can be suitably set within a range of less than 1 excluding 1. Making an area ratio F of the quantum dots 22 less than 1 excluding 1 makes it possible to make a state density of carriers per a unit area in the current injection region 26 lower than that of the case that a layer number of the quantum well active layer is 1. Accordingly, making an area ratio of the quantum dots 22 less than 1 excluding 1 makes it possible to make a gain band wider than at least that of the case that a layer number of the quantum well active layer is 1.

It is more preferable to set an area ratio F of the quantum dots 22 to be below 0.4 including 0.4. Making an area ratio F of the quantum dots 22 to be less than 0.4 including 0.4 can more widen the gain band.

Further more preferably, an area ratio F of the quantum dots 22 is set to be about 0.1. An area ratio F of the quantum dots 22 is set to be as low as about 0.1, whereby the gain band can be much wider.

An SCH layer 28 of GaAs is formed on the InAs layer 24.

A p type $Al_{0.4}Ga_{0.6}As$ layer 30 is formed on the SCH layer 28.

A current constriction layer 32 of $Al_2O_3$ and a current pass layer 34 of AlAs are formed on the p type $Al_{0.4}Ga_{0.6}As$ layer 30.

A clad layer 36 of p type $Al_{0.4}Ga_{0.6}As$ is formed on the current constriction layer 32 and the current pass layer 34.

The layer films of the clad layer 36, the current constriction layer 32, the p type $Al_{0.4}Ga_{0.6}As$ layer 30, the SCH layer 28, InAs layer 24, the SCH layer 20, n type $Al_{0.4}Ga_{0.6}As$ layer 18, the current constriction layer 14 and the clad layer 12 is etched generally in a mesa. Thus, a light waveguide layer 38 is formed.

An AR coat film (not shown) is formed on both end surfaces of the light waveguide layer 38.

The photosemiconductor device according to the present embodiment is characterized mainly in that the quantum dots 22 of disuniform sizes are formed by a low area ratio F.

According to the present embodiment, the active layer is provided by the quantum dots 22, and an area ratio F of the quantum dots 22 is set low, whereby a state density of carriers per a unit area in the current injection region 26 can be low. According to the present embodiment, the quantum dots 22 are formed in disuniform sizes, whereby a blunt state density distribution can be obtained. Thus, the photosemiconductor device according to the present embodiment can have a wide gain band and good noise characteristics.

Making an area ratio F of the quantum dots 22 lower tends to make the gain smaller. However, making the light waveguide layer 38 longer can ensure sufficient gains. There is no special problem.

(Evaluation Result)

Then, the evaluation result of the photosemiconductor device according to the present embodiment will be explained with reference to FIG. 6. FIG. 6 is a graph of a gain spectrum of the photosemiconductor device according to the present embodiment. Energies of photons are taken on the horizontal axis, and powers are taken on the vertical axis. Example 1 indicates a gain spectrum of the photosemiconductor device according to the present embodiment, specifically a gain spectrum of the case that an area ratio F of the quantum dots is 0.1. Control 1 indicates a gain spectrum of the photosemiconductor device in the case that a layer number of the quantum well active layer is 1.

As indicated by Control 1, in the photosemiconductor device using the quantum well active layer, a half-width of the peak value of the gain spectrum is about 0.03 eV, which is relatively narrow.

In contrast to this, in the photosemiconductor device according to the present embodiment, continuous spectra are obtained in the range of 0.9 eV to 1.2 eV. A half-width of the peak of the gain spectrum is 0.17 eV, which is very wide.

Thus, according to the present embodiment, a gain band can be as wide as about 400 nm to 600 nm. The photosemiconductor device according to the present embodiment can have a very wide gain band which extends to above 50 THz. Thus, according to the present embodiment, WDM signals of wide bands can be amplified at once by one photosemiconductor device, which can contribute to drastic simplification of the systems and lower costs.

(Method for Fabricating the Photosemiconductor Device)

Next, the method for fabricating the photosemiconductor device according to the present embodiment will be explained with reference to FIGS. 7A to 8C.

Figure 7A:
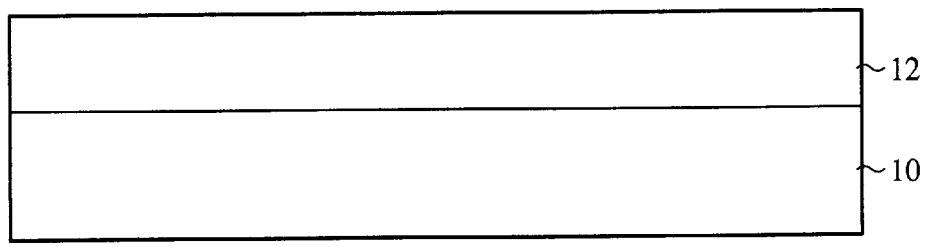
FIGS. 7A to 7C are sectional views of the photosemicondcutor device according to the embodiment of the present invention in the steps of the method for fabricating the photosemiconductor device, which show the method (Part 1).

As shown in FIG. 7A, the clad layer 12 of n type $Al_{0.4}Ga_{0.6}As$ is formed in a 1200 nm-thickness by MBE (Molecular Beam Epitaxial Growth) on the entire surface of a semiconductor substrate 10 of n type GaAs.

Figure 7B:
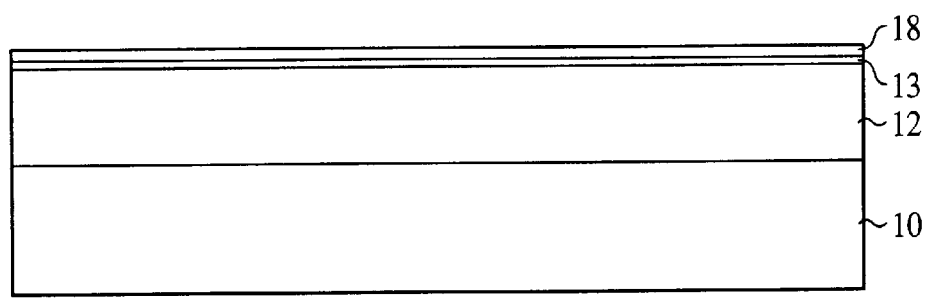

Then, as shown in FIG. 7B, the AlAs layer 13 is formed in a 80 nm-thickness on the entire surface by MBE.

Then, the n type $Al_{0.4}Ga_{0.6}As$ layer 18 is formed in a 150 nm-thickness on the entire surface by MBE.

Figure 7C:
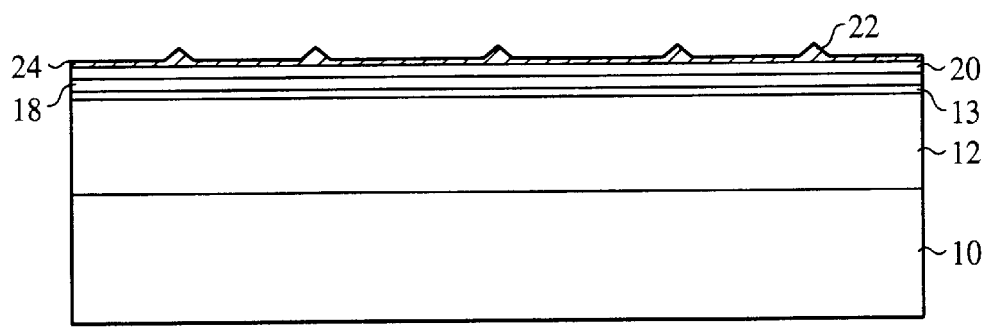

Next, as shown in FIG. 7C, the SCH layer 20 of GaAs is formed in a 100 nm-thickness on the entire surface by MBE.

Then, the InAs layer 24 is formed on the entire surface by MBE. Because InAs has a larger lattice constant than GaAs forming the SCH layer 20, the quantum dots 22 can be self-formed by S-K mode. Conditions for forming the InAs layer 24 are a substrate temperature of, e.g., 510° C., an InAs feed amount of, e.g., 1.5 ml and a growth time of, 250 seconds. The InAs layer 24 grown under these conditions have an area ratio F of, e.g., about 0.1, and the quantum dots 22 have disuniform sizes.

The conditions for forming the quantum dots 22 of disuniform sizes are not limited to the above. Sizes of the quantum dots 22 tend to be disuniform when a growth rate is made high, and a substrate temperature is low. A growth rate of forming the InAs layer 24 is made lower, feed amounts of the raw materials of the InAs layer 24 are decreased, and a substrate temperature is made high, whereby an area ratio F of the quantum dots 22 tends to be low. Accordingly, a growth rate and raw material feed amounts of the InA layer 24, a substrate temperature, etc. are suitably set, whereby the quantum dots 22 of disuniform sizes can be formed by a required area ratio F.

Figure 8A:
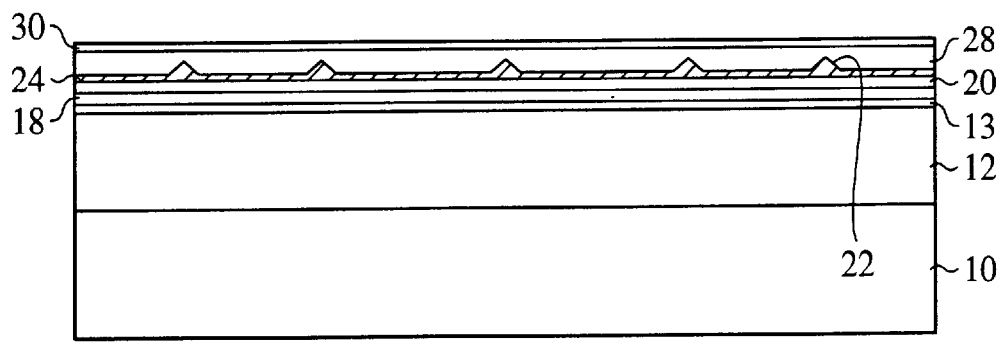
FIGS. 8A to 8C are sectional views of the photosemicondcutor device according to the embodiment of the present invention in the steps of the method for fabricating the photosemiconductor device, which show the method (Part 2).

Then, as shown in FIG. 8A, the SCH layer 28 of GaAs is formed in a 100 nm-thickness on the entire surface by MBE.

Next, the p type $Al_{0.4}Ga_{0.6}As$ layer 30 is formed in a 150 nm-thickness on the entire surface by MBE.

Figure 8B:
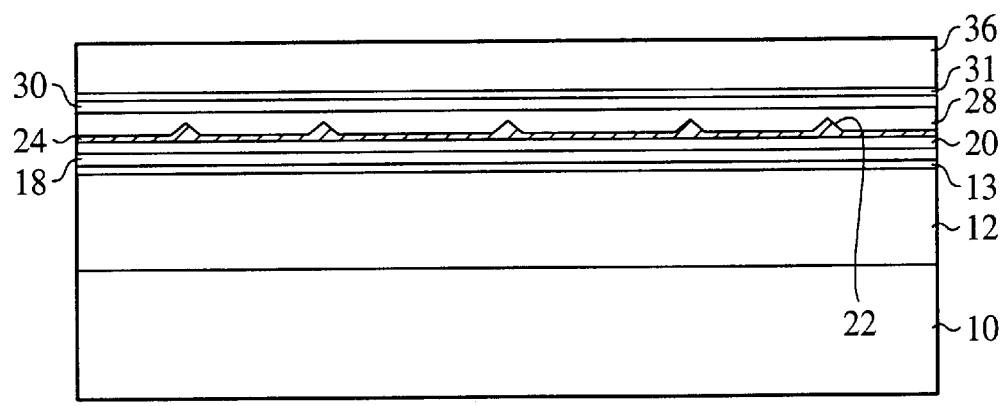

Next, as shown in FIG. 8B, the AlAs layer 31 of a 80 nm-thickness is formed on the entire surface by MBE.

Then, the clad layer 36 of p type $Al_{0.4}Ga_{0.6}As$ is formed in a 1200 nm-thickness on the entire surface by MBE.

Figure 8C:
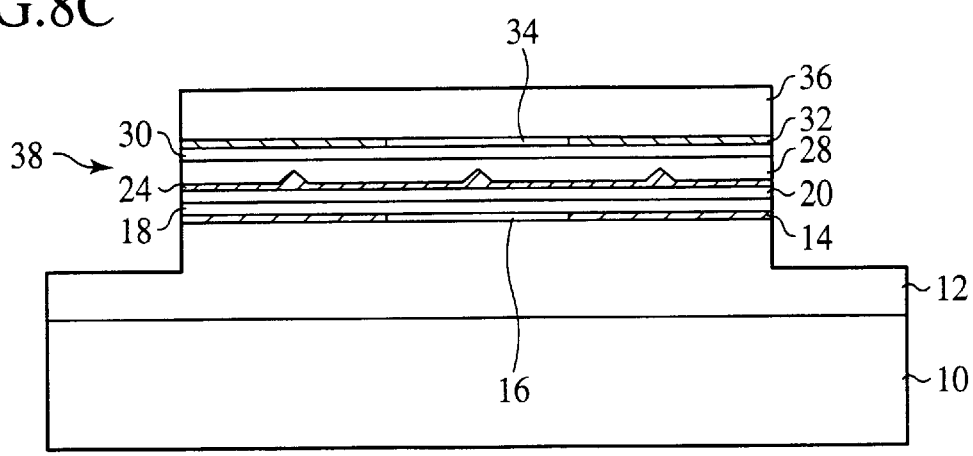
Figure 9:
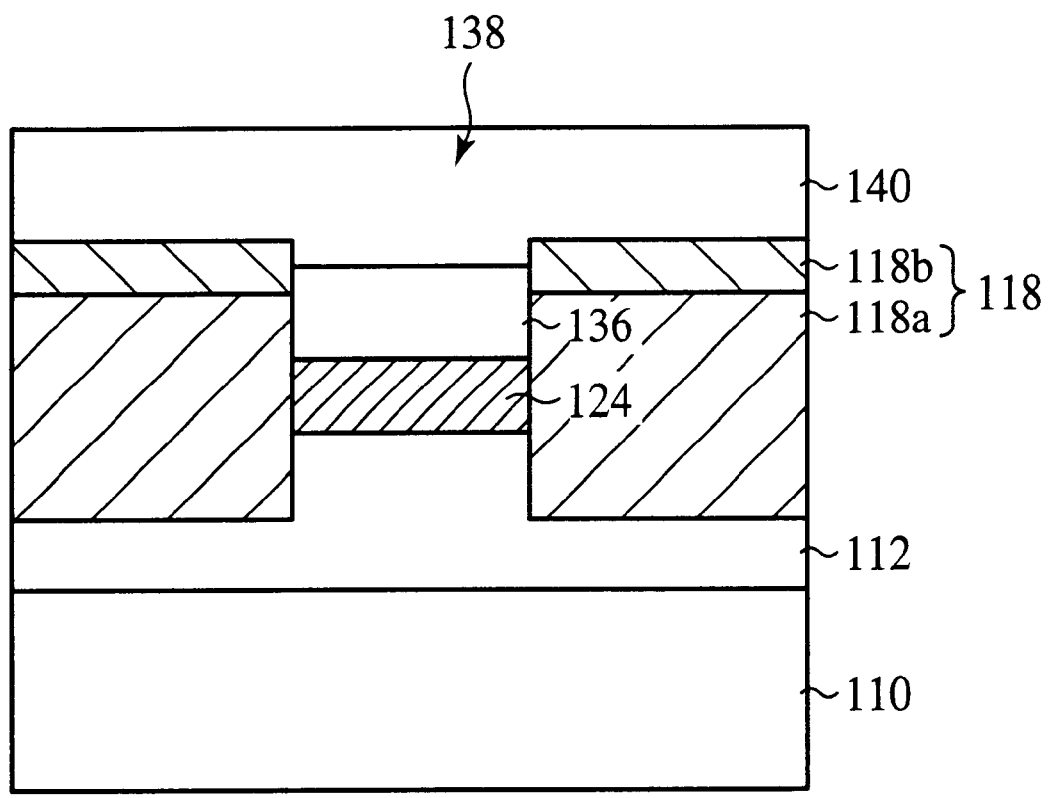
FIG. 9 is a sectional view of the conventional semiconductor light amplifier.

Next, as shown in FIG. 8C, the layer film of the clad layer 36, the AlAs layer 31, the p type $Al_{0.4}Ga_{0.6}As$ layer 30, the SCH layer 28, InAs layer 24, the SCH layer 20, n type $Al_{0.4}Ga_{0.6}As$ layer 18, the AlAs layer 13 and the clad layer 12 is etched in a mesa. A light waveguide layer 38 is thus formed.

Then, the AlAs layers 13, 31 at the part of the light waveguide layer 38 except for the central part thereof is oxidized to form the current constriction layers 14, 32 of $Al_2O_3$. The AlAs layers 13, 31 at the part which has not been oxidized become the current pass layers 16, 34.

Then, the AR coat film (not shown) is formed on both end surfaces of the light waveguide layer 38.

Thus, the photosemiconductor device according to the present invention is fabricated.

[Modifications]

The present invention is not limited to the above-described embodiment and can cover other various modifications.

For example, in the above-described embodiment, the principle of the present invention is applied to the semiconductor light amplifier. The principle of the present invention is applicable, as described above, not only to semiconductor light amplifiers but also to any other photosemiconductor devices, such as semiconductor lasers, etc. When the principle of the present invention is applied to semiconductor lasers, the semiconductor lasers can have wide variable wavelength range.

In the above-described embodiment, the quantum dots are formed in one layer. However, the quantum dots are not formed essentially in one layer and may be formed over a plurality of layers.

In the above-described embodiment, a material of the semiconductor substrate is a GaAs-based material. However, a material of the semiconductor substraste, etc. is not limited to GaAs-based materials and can be an InP-based material.

What is claimed is:

1. A photosemiconductor device comprising a plurality of quantum dots, the plurality of quantum dots having disuniform sizes, wherein the plural quantum dots are in three-dimensionally grown islands self-formed by S-K mode.

2. A photosemiconductor device according to claim 1, wherein when an area of a current injection region is A, and a total of areas of the plurality of quantum dots is B, an area ratio B/A of the plural quantum dots is below 0.4 including 0.4.

3. A photosemiconductor device according to claim 1, wherein the quantum dots are formed on an SCH layer; and a lattice constant of a material of the quantum dots is larger than that of a material of the SCH layer.

4. A photosemiconductor device according to claim 2, wherein the quantum dots are formed on an SCH layer; and a lattice constant of a material of the quantum dots is larger than that of a material of the SCH layer.

5. A photosemiconductor device according to claim 1, wherein the quantum dots are formed of InAs; and the SCH layer is formed of GaAs.

6. A photosemiconductor device according to claim 2, wherein the quantum dots are formed of InAs; and the SCH layer is formed of GaAs.

7. A photosemiconductor device according to claim 3, wherein the quantum dots are formed of InAs; and the SCH layer is formed of GaAs.

8. A photosemiconductor device according to claim 4, wherein the quantum dots are formed of InAs; and the SCH layer is formed of GaAs.

9. A photosemiconductor device according to claim 1, wherein the quantum dots are an active layer of a semiconductor amplifier.

10. A photosemiconductor device according to claim 2, wherein the quantum dots are an active layer of a semiconductor amplifier.

11. A photosemiconductor device according to claim 1, wherein the quantum dots are an active layer of a semiconductor laser.

12. A photosemiconductor device according to claim 2, wherein the quantum dots are an active layer of a semiconductor laser.

13. A method for fabricating a photosemiconductor device comprising the step of:

forming a plurality of quantum dots of disuniform sizes on a semiconductor substrate, the plural quantum dots being self-formed in three-dimensionally grown island by S-K mode.

14. A method for fabricating a photosemiconductor device according to claim 13, wherein in the step of forming a plurality of quantum dots, the plurality of quantum dots are formed so that when an area of a current injection region is A, and a total of areas of the plurality of quantum dots is B, an area ratio B/A of the plural quantum dots is below 0.4 including 0.4.

15. A photosemiconductor device according to claim 13, further comprising the step of:

forming an SCH layer of a material having a lattice constant smaller than that of the quantum dots on the semiconductor substrate before the step of forming quantum dots.

16. A photosemiconductor device according to claim 14, further comprising the step of:

forming an SCH layer of a material having a lattice constant smaller than that of the quantum dots on the semiconductor substrate before the step of forming quantum dots.

* * * * *